US009728665B2

(12) United States Patent
Ronda et al.

(10) Patent No.: US 9,728,665 B2
(45) Date of Patent: Aug. 8, 2017

(54) LUMINESCENT SOLAR ENERGY CONCENTRATOR WITH A NEW ARCHITECTURE

(75) Inventors: Cornelis Reinder Ronda, Aachen (DE); Dirk Kornelis Gerhardus De Boer, Den Bosch (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 1115 days.

(21) Appl. No.: 13/391,837

(22) PCT Filed: Aug. 19, 2010

(86) PCT No.: PCT/IB2010/053744
§ 371 (c)(1),
(2), (4) Date: Mar. 13, 2012

(87) PCT Pub. No.: WO2011/024104
PCT Pub. Date: Mar. 3, 2011

(65) Prior Publication Data
US 2012/0160301 A1    Jun. 28, 2012

(30) Foreign Application Priority Data

Aug. 25, 2009    (EP) ..................................... 09168603

(51) Int. Cl.
*H01L 31/042*    (2014.01)
*H01L 31/055*    (2014.01)
(Continued)

(52) U.S. Cl.
CPC .......... *H01L 31/055* (2013.01); *G01J 1/0422* (2013.01); *G02B 6/42* (2013.01); *Y02E 10/52* (2013.01)

(58) Field of Classification Search
CPC ............... H01L 31/054; H01L 31/0543; H01L 31/0547; H01L 31/0549; H01L 31/055;
(Continued)

(56) References Cited

U.S. PATENT DOCUMENTS

| 4,140,544 A | 2/1979 | Sill |
| 4,186,033 A | 1/1980 | Boling et al. |

(Continued)

FOREIGN PATENT DOCUMENTS

| JP | 2012526157 | 10/2012 |
| WO | 2006088369 A2 | 8/2006 |

(Continued)

OTHER PUBLICATIONS

Rowan, B.c., L.r. Wilson, and B.s. Richards. "Advanced Material Concepts for Luminescent Solar Concentrators." IEEE J. Select. Topics Quantum Electron. IEEE Journal of Selected Topics in Quantum Electronics 14.5 (2008): 1312-322.*

(Continued)

*Primary Examiner* — Matthew Martin
*Assistant Examiner* — Kourtney S Carlson

(57) ABSTRACT

A luminescent concentrator for solar light is provided. The luminescent concentrator comprises a wavelength-selective filter, an energy concentrating area, and a luminescent material. The wavelength-selective filter is adapted to pass the solar light and to reflect light emitted by the luminescent material. Further, a method for concentrating solar light is provided. The method comprises the steps of (a) passing incident solar light through a wavelength-selective filter and an energy concentrating area onto a luminescent material, and (b) converting the incident solar light in the luminescent material to light having a wavelength reflectable by the wavelength-selective filter. The method further comprises a step (c) of concentrating the converted light in a pre-
(Continued)

determined area arranged between the wavelength-selective filter and the luminescent material.

9 Claims, 1 Drawing Sheet

(51) Int. Cl.
    *G01J 1/04*     (2006.01)
    *G02B 6/42*     (2006.01)

(58) Field of Classification Search
    CPC . H01L 27/30; H01L 27/146; H01L 27/14649; G01J 1/0422; G01J 3/0216; G02B 6/42
    USPC ........ 136/242–265; 250/338.4, 483.1, 484.2; 362/84, 296.01, 297, 307, 296.05, 296.09, 362/341, 367; 359/298, 726, 850, 851; 385/8, 129
    See application file for complete search history.

(56) References Cited

U.S. PATENT DOCUMENTS

| | | | | |
|---|---|---|---|---|
| 4,329,535 | A * | 5/1982 | Rapp | .................... H01L 31/055 136/247 |
| 7,064,969 | B2 | 6/2006 | West | |
| 8,231,256 | B1 * | 7/2012 | Coleman | ................ F21V 7/043 362/231 |
| 2003/0071956 | A1 * | 4/2003 | Sasaki | ................ G02F 1/13394 349/155 |
| 2008/0000526 | A1 | 1/2008 | Madigan | |
| 2008/0223438 | A1 * | 9/2008 | Xiang | ............... H01L 31/02322 136/257 |
| 2009/0014055 | A1 * | 1/2009 | Beck et al. | .................. 136/246 |
| 2009/0044861 | A1 | 2/2009 | Debije et al. | |
| 2009/0095341 | A1 | 4/2009 | Pfenninger et al. | |
| 2009/0110356 | A1 * | 4/2009 | Xiang | ..................... G02B 6/10 385/129 |
| 2009/0151771 | A1 * | 6/2009 | Kothari | ................. G02B 5/284 136/246 |
| 2009/0162011 | A1 * | 6/2009 | Coe-Sullivan et al. | ........ 385/31 |

FOREIGN PATENT DOCUMENTS

| | | |
|---|---|---|
| WO | 2006088370 A2 | 8/2006 |
| WO | 2007138589 A2 | 12/2007 |
| WO | 2008157621 A2 | 12/2008 |
| WO | 2010067296 A1 | 6/2010 |

OTHER PUBLICATIONS

STMicroelectronics, "General-purpose single bipolar timers", Nov. 2008, pp. 1-20.

Texas Instruments, www.ti.com, "Interleaving Continuous Conduction Mode PFC Controller", SLUS794A, Nov. 2007, pp. 1-39.

Laszlo Huber et al, "Open-Loop Control Methods for Interleaved DCM/CCM Boundary Boost PFC Converters", IEEE Transactions on Power Electronics, vol. 23, No. 4, Jul. 2008, pp. 1649-1657.

Ulrich Boeke et al, "Transformer-less converter concept for a grid-connection of thin-film photovoltaic modules", IEEE, 2008, 978-1-4344-2279-1.

Huber et al: "Open-Loop Control Methods for Interleaved DCM/CCM Boundary Boost PFC Converters"; IEEE Transactions on Power Electronics, vol. 23, No. 4, Jul. 2008, pp. 1649-1657.

Schmidt et al: "Wechselwirkungen Zwischen Solarmodulen Und Wechselrichtern"; Article on Solar Paneling From the Company Solare Energiesysteme in Freiburg, Germany, Printed in Sonne Wind & Warme Apr. 2007, 9 Page Article.

* cited by examiner

LUMINESCENT SOLAR ENERGY CONCENTRATOR WITH A NEW ARCHITECTURE

TECHNICAL FIELD OF THE INVENTION

The invention relates to a luminescent concentrator. For example, the luminescent concentrator may be used in connection with solar energy in order to concentrate incident solar light for subsequent conversion in a photovoltaic system.

BACKGROUND OF THE INVENTION

In order to reduce the costs of solar energy generation in photovoltaic systems, it is desirable to make efficient use of the most expensive part of the system, namely the photovoltaic cell (for example, by providing increased current generation by using larger light fluxes). Conventionally, this is done by using large light-focusing solar concentrators.

For example, luminescent solar concentrators are used in connection with waveguides in this technical field. Basically, these luminescent concentrators consist of a large glass plate doped with fluorescent dye molecules. The dyes absorb light of specific wavelengths from the solar light incident upon it, and re-emit the light in all directions at longer wavelengths. A portion of this light is emitted within the critical angle of the supporting waveguide and is totally internally reflected and transported to the photovoltaic module of the photovoltaic system.

However, these luminescent concentrators presently show poor efficiency originating from a high re-absorption of the emitted light, from a poor efficiency of coupling light into the waveguide and from a poor efficiency in keeping the light within the waveguide.

Currently, there is a large worldwide research activity dealing with improvements of luminescent solar energy concentrators. Such current concentrators usually consist of a matrix in which luminescent materials are applied. Incident solar light is downconverted in a luminescent process as soon as it reaches the luminescent material and can then be used in a photovoltaic module.

However, again re-absorption of converted light strongly contributes to energy losses in these luminescent concentrators. The optical gain factors (ratio of incident light intensity and light intensity received by the photovoltaic module) that can be achieved are limited by these re-absorption effects. With respect to the current luminescent concentrators, re-absorption effects occur in the luminescent materials, and additionally the matrix itself may also negatively affect the optical gain factors by optical absorption in the matrix.

SUMMARY OF THE INVENTION

It is therefore an object of the present invention to provide a luminescent concentrator reducing re-absorption losses in luminescent concentrators for use in photovoltaic systems.

The present invention solves the above problem by providing a luminescent concentrator converting solar light passing through a filter. The light is converted in a luminescent material and concentrated in an area between the filter and the luminescent material.

According to the present invention, a luminescent concentrator for solar light is provided. The luminescent concentrator comprises a wavelength-selective filter, an energy concentrating area, and a luminescent material. The wavelength-selective filter is adapted to pass solar light and to reflect light emitted by the luminescent material.

A wavelength-selective filter may be a multilayer interference filter or a photonic band-stop filter. For example, the wavelength-selective filter may be a mirror transparent at specific wavelengths and reflective at other wavelengths of incident light, optionally with polarization selectivity. In particular, the wavelength-selective filter allows incident solar light passing through, but reflects converted light emitted from the luminescent material because of the different wavelengths of these two kinds of light. For example, the wavelength of the converted/emitted light from the luminescent material is larger than the wavelength of the incident solar light previously passing the filter. Wavelength-selective mirrors are further explained in, for example, US 2009/0044861 A1.

An energy concentrating area may be an air gap or may contain a vacuum or may be or consist of any other material (essentially and/or significantly) not affecting the concentrating of (converted) light passing through the energy concentrating area. For example, the energy concentrating area does not contain or consist of a material (e.g. significantly) absorbing incident light. In other words, the energy concentrating area is essentially empty (i.e. free of a material/component/configuration negatively affecting (for example, by absorbing at least parts of the light present in the energy concentrating area) the concentration and/or reflection of light). In a particular embodiment, the area may provide the same (or an even larger) thickness as the luminescent material arranged below the energy concentrating area.

Due to the presence of the energy concentrating gap which does not contain or consist of a material absorbing light, energy losses of the converted light to be concentrated in the area are decreased or even minimized. Thus, the luminescent concentrator may advantageously enhance the overall output of a solar cell/photovoltaic device connected to the area.

A luminescent material is adapted to emit light upon absorption of light or other radiation of sufficient quantum energy and covers both, fluorescence and phosphorescence. For example, the luminescent material contains a plurality of luminescent dye molecules. In a particular embodiment, the luminescent material is not embedded within a (polymeric) matrix, but the luminescent material is directly deposited or sputtered onto a substrate as, for example, onto a reflective structure as discussed below.

The omission of any matrix into which the luminescent material is immobilized may advantageously avoid any further re-absorption of the incident and/or converted light by the matrix while the light is concentrated in the energy concentrating area between the filter and the luminescent material. Hence, any energy losses are further decreased.

In a particular embodiment, the luminescent material may comprise line emitters, i.e. phosphorescent or fluorescent materials of which the spectral width of the emission peak is narrow, preferentially below 30 nm. The use of such line emitters may be advantageous, since reflections at very wide angular ranges are possible within the energy concentrating area.

In a particular embodiment, the luminescent material may be a luminescent layer.

A "layer" of luminescent material may provide a uniform thickness and a plane-like surface. For example, the thickness of the luminescent layer may be less than 100 μm, preferably less than 20 μm.

In a particular embodiment, the luminescent layer may be a layer arranged on a reflective structure.

A reflective structure is a structure adapted to reflect incident solar light. Particularly, a reflective structure reflects at least 75%, preferably at least 90%, more preferably at least 95% or even at least 99% of the incident light. The reflective structure may be a metallic mirror made from e.g. aluminum or silver, or a diffuse reflector, which may comprise, e.g., $BaSO_4$ or $TiO_2$, and/or a non-reflective structure may be covered by a coating of such a metallic or diffuse material to provide reflectivity. However, any other material may be used, as long as it provides reflectivity to the structure and as long as its optical properties do not (significantly) change under prolonged excitation with UV (ultraviolet), VIS (visible) or IR (infrared) light.

In a particular embodiment, the luminescent layer as discussed above may be deposited on the reflective structure. For example, the luminescent layer may be a thin luminescent film.

Deposition of the luminescent layer may be carried out in a deposition chamber, e.g. in a pulsed laser deposition (PLD) chamber, or the deposition may be carried out by means of a sputtering technique. Pulsed laser deposition is a thin film deposition technique, for example a physical vapor deposition PVD technique, wherein a high power pulsed laser beam is focused inside a vacuum chamber and directed towards a target having the same composition to be deposited onto a substrate (in the present case, the substrate may be the reflective structure as discussed above).

Deposition of the luminescent material may be advantageous, since the deposition technique allows to ablate an exactly determined composition and a precise density of the composition to be deposited onto a substrate (e.g. the reflective structure). Hence, the high and well-defined quality of the luminescent material enhances the absorption and conversion of the incident solar light.

In a particular embodiment, the luminescent layer may be formed by coating of a suspension in which the phosphorescent or fluorescent material is dispersed or a solution in which it is dissolved or dispersed. Such a suspension or solution may be applied like a paint, e.g. by blade coating or by spray coating. The suspension or solution may contain a polymer binder. It also may contain a solvent that can be evaporated.

In a particular embodiment, the luminescent layer may comprise a phosphorous compound.

Phosphorous materials may be of particular interest, since they may be stimulated by an incident light beam so that the previously stored energy (for example due to light absorption) in the phosphorous material is emitted by luminescence. In addition, reabsorption effects might be small.

In a particular embodiment, the luminescent concentrator may comprise a mechanical support structure between the wavelength-selective filter and the luminescent material.

For example, the mechanical support structure may comprise pillars and/or spacer balls or any other geometrical structure or material adapted to mechanically reinforce the filter and/or the luminescent material. In a particular embodiment, the mechanical support structure is made of the same material as the reflective structure discussed above and/or may be arranged between the reflective structure and the wavelength-selective filter. For example, the mechanical support structure may be pillars extending from the filter through the luminescent material to the reflective structure.

In a particular embodiment, the mechanical support structure may comprise a reflector material, e.g. a white reflector material as $BaSO_4$. For example, the mechanical support structure, e.g. the pillars and/or the spacer balls may be coated with the reflector material.

Having a reflective coating on the mechanical support structure may further enhance the concentrating of the converted light in the energy concentrating area and may thus further increase the overall output of a photovoltaic device connected to the energy concentrating area.

In a particular embodiment, the mechanical support structure is arranged in the energy concentrating area and does not (significantly/essentially) absorb any light.

In a particular embodiment, the luminescent concentrator may further comprise a photovoltaic device connected to the energy concentrating area.

A photovoltaic device may be a photovoltaic module or array (a packaged interconnected assembly of photovoltaic cells) or even a single photovoltaic/solar cell. Solar cells use light energy (photons) from the sun to generate electricity through the "photovoltaic effect". For example, a solar cell may be made of a wafer or thin film of crystalline or amorphous silicon.

Due to the connection of the luminescent concentrator to the photovoltaic device, the incident solar light is converted to luminescent light that is concentrated by the luminescent concentrator as discussed above and then directed to the photovoltaic device for conversion into electricity. In doing so, an advantageous photovoltaic system of the luminescent concentrator and the photovoltaic device is provided, increasing the overall output of the system due to the concentration of incident light as discussed above.

In a particular embodiment, a special means (e.g. matching-index glue) for rendering optical the connection of the luminescent concentrator to the photovoltaic device is not used between the luminescent concentrator and the photovoltaic device.

According to the present invention, a method for concentrating solar light is provided. The method comprises the steps of (a) passing incident solar light through a wavelength-selective filter and an energy concentrating area onto a luminescent material, and (b) converting the incident solar light in the luminescence material to light having a wavelength reflectable by the wavelength-selective filter. The method further comprises a step (c) of concentrating the converted light in a pre-determined area arranged between the wavelength-selective filter and the luminescent material.

In a particular embodiment, the wavelength-selective filter, the energy concentrating area, and the luminescent material have the same features as described above in connection with the luminescent concentrator of the invention. That means that features and their explanations mentioned with respect to the luminescent concentrator may also be applied to the method of the invention and vice versa.

In a particular embodiment, the pre-determined area may be the energy concentrating area.

For example, the incident solar light passes through the wavelength-selective filter and the energy concentrating area onto the luminescent material, is converted, and then emitted (back) into the energy concentrating area to be concentrated and directed to, e.g., a photovoltaic device.

In a particular embodiment, and as discussed above, the pre-determined area may be an air gap or may comprise a vacuum.

In a particular embodiment, the step of concentrating the converted light may comprise a step of (c1) reflecting the converted light between the wavelength-selective filter and a reflective structure arranged on the luminescent material opposite to the pre-determined area.

In a particular embodiment, the method may further comprise a step (d) of directing the concentrated converted light to/onto a photovoltaic device.

DETAILED DESCRIPTION OF EMBODIMENTS

Figure 1:
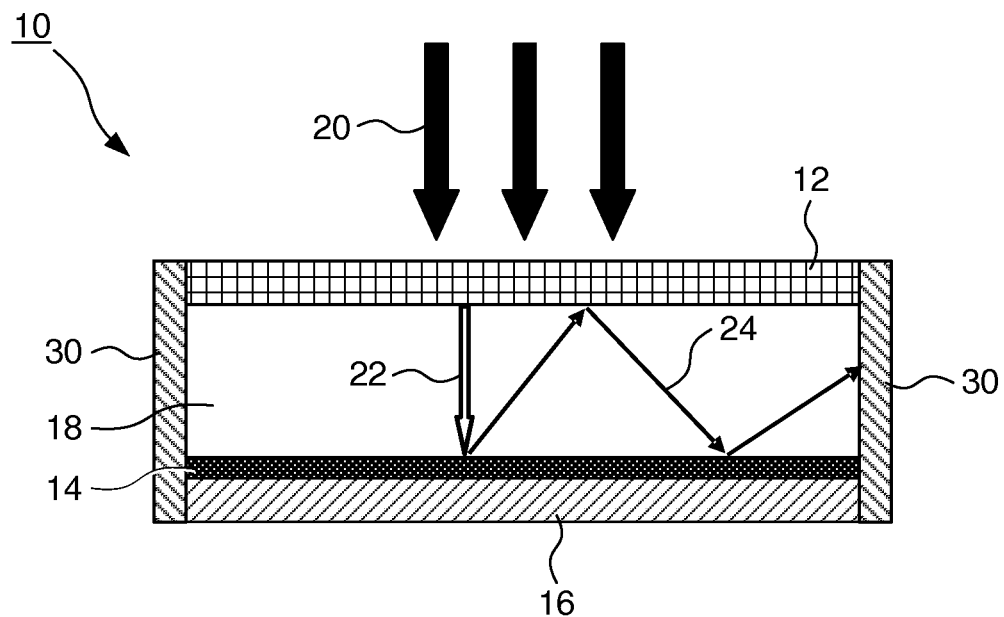
FIG. 1 schematically shows the general configuration of an embodiment of a luminescent solar energy concentrator according to the invention.

FIG. 1 schematically shows a configuration of an embodiment of a luminescent concentrator 10. The luminescent concentrator 10 comprises a wavelength-selective filter 12, a luminescent material 14 and an energy concentrating area 18, for example an air gap, therebetween. In the embodiment, the filter 12 is arranged at the top of the concentrator 10 so that incident solar light 20 can optimally reach the filter 12. A part of the incident solar light 22 passes through the filter 12 and the area 18 onto and/or into the luminescent material 14. This part 22 is absorbed by the luminescent material 14 and converted to converted light 24. For example, a large Stokes Shift between absorbed light 22 and emitted/converted light 24 may be provided so that the converted light 24 provides for a larger wavelength than the solar light 22. The converted light 24 is then concentrated in the area 18 between the filter 12 and the luminescent material 14. In particular, a reflective structure 16 may be provided at the lower part or the bottom of the concentrator 10 below the luminescence material 14 in order to provide for the concentrating of the light 24 in area 18, and the filter 12 at the upper part/top of the concentrator 10 may also be adapted to reflect the converted light 24 having a larger wavelength than the incident light 20 which passed the filter 12 before. Hence, the area 18 may function as a light guide directing the converted light 24 by means of multiple reflections to a photovoltaic device 30.

Figure 2:
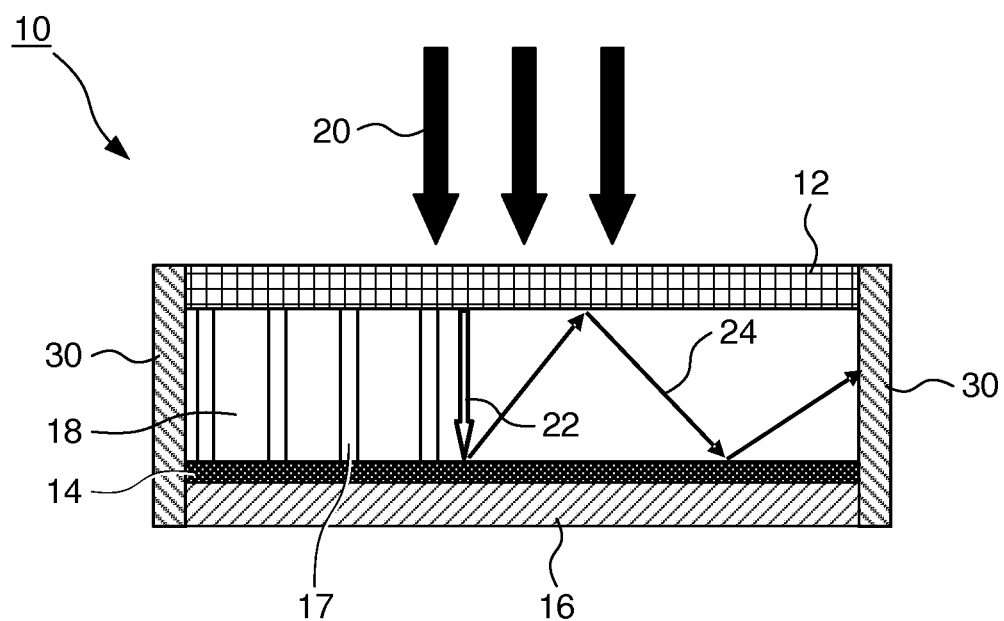
FIG. 2 schematically shows an embodiment of a luminescent solar energy concentrator with a stabilizing structure according to the invention.

FIG. 2 schematically shows another embodiment of a luminescent concentrator 10. In particular, the luminescent concentrator 10 may provide the same features as the luminescent concentrator 10 as discussed with reference to FIG. 1, but may additionally comprise spacer balls and/or pillars 17 as support structure(s) in the area 18 between the filter 12 and the luminescent material 14. Similar to the above embodiment in FIG. 1, the luminescent concentrator 10 comprises a wavelength-selective filter 12, a luminescent material 14, and an energy concentrating area 18 between the luminescent material 14 and the filter 12. Solar light 21 passing through the filter 12 and the area 18 is absorbed by the luminescent material 14 and converted to a light 24 having a larger wavelength than the filtered solar light 22. The converted light 24 is then concentrated in the area 18. A reflective structure 16 at the bottom of the concentrator 10 is arranged below the luminescence material 14 and provides for the concentrating of the light 24 in area 18, together with the filter 12 at the top of the concentrator 10: the filter 12 is a wavelength-selective filter and is adapted to reflect the converted light 24, whereas a part 22 of the incident light 20 can pass through the filter 12, depending on the different wavelengths of the incident light 20 and the converted light 24. Finally, the converted light 24 is directed to a photovoltaic device 30 for converting the light 24 into electricity. It is to be understood that one essential feature of the current invention is the omission of a waveguide for guiding light to the photovoltaic device 30 as part of the luminescent concentrator 10 as is described in the documents of the prior art. This feature shows the advantage of a higher light efficiency as the prior art waveguide absorbs light. Instead, the light is guided and reflected by the wavelength-selective filter 12 and the luminescent material 14 as described and shown in the Figs. Further, the waveguide is apart from guiding light also used as a mechanical support structure in prior art. Therefore, the provision of a mechanical support structure 17 within the luminescent concentrator 10 as an example of the invention is advantageous for stability of the luminescent concentrator 10 described.

While the invention has been illustrated and described in detail in the drawings and foregoing description, such illustration and description are to be considered illustrative or exemplary and non-restrictive; the invention is thus not limited to the disclosed embodiments. Variations to the disclosed embodiments can be understood and effected by those skilled in the art and practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures can not be used to advantage. Any reference signs in the claims should not be considered as limiting the scope.

The invention claimed is:

1. A luminescent concentrator for solar light comprising, a wavelength-selective filter;
a reflective surface at the bottom of the concentrator;
a luminescent material deposited or sputtered on the reflective surface;
an energy concentrating area between the wavelength-selective filter and the luminescent material,
wherein the wavelength-selective filter is adapted to pass the solar light and to reflect light emitted by the luminescent material,
wherein the energy concentrating area consists of reflective spacer balls and either an air gap or vacuum,
wherein the luminescent concentrator further directs light to a photovoltaic device; and
wherein the reflective spacer balls are coated with a reflective material and adapted to mechanically reinforce the filter and/or the luminescent material.

2. The luminescent concentrator of claim 1, wherein the luminescent material is a luminescent film.

3. The luminescent concentrator of claim 2, wherein the luminescent layer comprises a phosphorous compound.

4. The luminescent concentrator of claim 1, wherein the wavelength-selective filter is a photonic band-stop filter.

5. The luminescent concentrator of claim 1, wherein the luminescent concentrator comprises a mechanical support structure between the wavelength-selective filter and the luminescent material.

6. The luminescent concentrator of one claim 1, wherein the photovoltaic device is connected to the energy concentrating area.

7. Method for concentrating solar light, comprising the steps of:
inserting spacer balls coated with a reflective material, spanning an energy concentrating area between a wavelength-selective filter and a luminescent material;

passing incident solar light through the wavelength-selective filter and the energy concentrating area onto the luminescent material deposited or sputtered onto a reflective interior surface below the energy concentrating area that faces the wavelength-selective filter;

converting incident solar light in the luminescent material to light having a wavelength reflectable by the wavelength-selective filter;

concentrating the converted light in the energy concentrating area arranged between the wavelength-selective filter and the luminescence material;

reflecting the converted light between the wavelength selective filter and the reflective surface positioned under the luminescent material, and collecting the reflected light at a photovoltaic device along a side of the energy concentrating area and wherein the energy concentrating area consists of the spacer balls and either an air gap or vacuum.

8. The luminescent concentrator of claim 6 wherein the photovoltaic device forms a sidewall at least partially between the wavelength selective filter and the luminescent material.

9. A luminescent concentrator for solar light, comprising:

a wavelength-selective filter allowing solar light to enter the luminescent concentrator;

an energy concentrating area below the wavelength selective filter;

a luminescent material in opposing relationship with the wavelength selective filter and separated from the wavelength selective filter by the energy concentrating area;

a reflective structure below the luminescent material to redirect luminescent light into the energy concentrating area to concentrate light in the energy concentrating area in conjunction with the wavelength selective filter;

and reflective spacer balls coated with a reflective material configured to span the energy concentrating area between the wavelength-selective filter and the luminescent material;

wherein the wavelength-selective filter is adapted to pass the solar light and to reflect light emitted by the luminescent material;

wherein the energy concentrating area is consists of the spacer balls and either an air gap or vacuum, and the luminescent concentrator further directing light to a photovoltaic device extending along at least one wall of the energy concentrating area.

* * * * *